(12) United States Patent
Nadeau-Dostie et al.

(10) Patent No.: US 6,868,532 B2
(45) Date of Patent: Mar. 15, 2005

(54) METHOD AND PROGRAM PRODUCT FOR DESIGNING HIERARCHICAL CIRCUIT FOR QUIESCENT CURRENT TESTING AND CIRCUIT PRODUCED THEREBY

(75) Inventors: Benoit Nadeau-Dostie, Aylmer (CA); Jean-François Côté, Chelsea (CA)

(73) Assignee: LogicVision, Inc., San Jose, CA (US)

( * ) Notice: Subject to any disclaimer, the term of this patent is extended or adjusted under 35 U.S.C. 154(b) by 284 days.

(21) Appl. No.: 10/011,128

(22) Filed: Dec. 10, 2001

(65) Prior Publication Data
US 2003/0110457 A1 Jun. 12, 2003

(51) Int. Cl.[7] ............................................. G06F 17/50
(52) U.S. Cl. ............................................ 716/4; 714/724
(58) Field of Search ............................ 716/4; 714/724, 714/735, 738–739, 741

(56) References Cited

U.S. PATENT DOCUMENTS

| | | | | |
|---|---|---|---|---|
| 5,067,091 A | * | 11/1991 | Nakazawa | 716/3 |
| 5,459,737 A | * | 10/1995 | Andrews | 714/733 |
| 5,592,493 A | | 1/1997 | Crouch et al. | |
| 5,796,990 A | * | 8/1998 | Erle et al. | 716/4 |
| 5,939,897 A | | 8/1999 | Ayers et al. | |
| 5,949,692 A | * | 9/1999 | Beausang et al. | 716/18 |
| 5,987,636 A | * | 11/1999 | Bommu et al. | 714/738 |
| 6,061,284 A | | 5/2000 | Dingemanse et al. | |
| 6,093,212 A | | 7/2000 | Takahashi et al. | |
| 6,098,187 A | | 8/2000 | Takahashi | |
| 6,151,694 A | * | 11/2000 | Nozuyama | 714/724 |
| 6,173,426 B1 | | 1/2001 | Sanada | |
| 6,175,244 B1 | | 1/2001 | Gattiker et al. | |
| 6,487,688 B1 | * | 11/2002 | Nadeau-Dostie | 714/726 |
| 6,516,432 B1 | * | 2/2003 | Motika et al. | 714/732 |
| 6,718,524 B1 | * | 4/2004 | Mbouombouo | 716/4 |
| 2001/0018756 A1 | | 8/2001 | Chang et al. | |

\* cited by examiner

Primary Examiner—Stacy A. Whitmore
(74) Attorney, Agent, or Firm—Eugene E. Proulx

(57) ABSTRACT

A method of designing integrated circuits having an hierarchical structure for quiescent current testing, and the circuit which results therefrom is disclosed. The method comprises analyzing each of one or more selected hierarchical blocks independently of other selected blocks identify any circuit states of each block which could result in elevated quiescent current levels during quiescent current testing of the circuit, the analysis beginning with blocks at a lowest level of hierarchy and proceeding in sequence through each level of design hierarchy to a highest level of hierarchy containing a top-level block; and calculating a fault coverage for each selected block.

78 Claims, 8 Drawing Sheets

Block 12 single chain:
E->D->C->F->I->J->H->G

Block 16 single chain:
P->O->R->U->S->T

Host Block Single chain:
L->K->B->A->D->C->I->M->O->
U->V->P->N->J->E->Q

NOTE: The values adjacent to each state transition correspond to TMS.

ured in the memory elements of the circuit. The
METHOD AND PROGRAM PRODUCT FOR DESIGNING HIERARCHICAL CIRCUIT FOR QUIESCENT CURRENT TESTING AND CIRCUIT PRODUCED THEREBY The present invention relates, in general to the design and testing of integrated circuits and, more specifically, to a method and a program product for designing circuits in a manner to facilitate quiescent current (IDDq) testing of the circuit and to a circuit designed according to the method.

BACKGROUND OF THE INVENTION

The complexity of semiconductor circuits often requires partitioning the circuit design into several core modules or blocks, generally referred to as design hierarchy. The blocks can be verified and laid out independently from each other. This design approach has been used for a long time and has several benefits, the most significant of which are to accelerate the development of the design by allowing several designers to work in parallel and to reduce the difficulty for design automation tools by avoiding the need to manipulate the description of the entire circuit at once.

It has been shown recently that scan test methods can be adapted to a hierarchical design methodology by adding scannable memory elements around the periphery of core modules or by modifying functional memory elements near the periphery of modules and providing an internal and external mode of operation to these memory elements (see, for example, "A structured and Scalable Mechanism for Test Access to Embedded Reusable Cores", ITC '98. paper 12.1, Marinessen et al. and Applicants' co-pending U.S. patent application Ser. No. 09/626,877 filed on Jul. 27, 2000 for "Hierarchical Design and Test Method and System, Program Product Embodying the Method and Integrated Circuit Produced Thereby", both incorporated herein by reference.) In this divide-and-conquer approach, scan tests of modules can be prepared in advance by the designer of the core module or block without any knowledge of the context within which it will be used.

The preparation of the scan tests involves at least the verification of design-for-test rules and calculation of test coverage. During the internal scan test of blocks, the state of memory elements outside of the modules is irrelevant. The preparation also involves the generation of a simplified model of the module that can be used to perform the same steps at the next level of hierarchy of the design. The use of the simplified model eliminates the need to manipulate the entire description of core modules. During the external scan test of modules, the state of memory elements that are not involved (i.e. not near the periphery of the module) is, again, irrelevant. Core modules can be tested in parallel or sequentially.

There is one type of test that does not readily lend itself to this hierarchical design methodology. During circuit manufacturing, it is often required to measure the quiescent current (IDDq) for different states of the circuit. The quiescent current is used as a complement to the scan tests described earlier. The state of the circuit is defined by the values loaded in the memory elements of the circuit. The designer needs to ensure that each state of the circuit corresponds to a state where no static current is consumed in a good circuit. A software tool (rules checker) is typically used to perform this task. The designer can also calculate the fault coverage of the faults covered by this test using a fault simulator and/or an automatic test pattern generator (ATPG). To date, the quiescent current test, and the analysis required to perform it, requires considering the entire circuit at once which is becoming virtually impractical for large circuits.

SUMMARY OF THE INVENTION

The present invention provides a hierarchical design method for integrated circuits to be tested using quiescent current monitoring and a circuit designed according to the method. The method allows the state of the entire circuit to be set in a repeatable and predictable manner which avoids the need to analyze the entire circuit at once. The circuit is divided into hierarchical blocks or modules according to a design hierarchy. The blocks have scannable memory elements which are organized into scan chain segments with at least one segment being a peripheral scan chain segment. The peripheral segment is comprised of input and output peripheral scannable memory elements which are configurable in an internal test mode and an external test mode.

One aspect of the present invention is broadly defined as a method of designing integrated circuits, having at least one hierarchical block, for quiescent current testing, comprising analyzing each of one or more selected hierarchical blocks independently of other selected blocks in the same or higher levels of hierarchy to identify circuit states of each the selected blocks which could result in elevated quiescent current levels during quiescent current testing of the circuit, the analyzing beginning with blocks at a lowest level of design hierarchy and proceeding in sequence through each level of design hierarchy to a highest level of hierarchy containing a top-level block; and calculating a fault coverage of for each the selected block.

Another aspect of the present invention is generally defined as a circuit having at least one hierarchical block, the circuit comprising: each block having scannable memory elements arranged into two or more scan chain segments having a serial input and a serial output, the memory elements including peripheral memory elements associated with block inputs and outputs, the peripheral scannable memory elements being arranged in peripheral scan chain segments, input peripheral elements being configurable in internal test mode for testing circuitry within the block and output peripheral memory elements being configurable in external test mode for testing circuitry external of the block; means associated with each segment and responsive to an active quiescent current test signal for connecting the serial input of the segment to a block serial input, or to the serial output of another scan chain segment, or to the serial output of a peripheral scan chain segment of a block located at one level of hierarchy down; and means responsive to the active quiescent current test signal for concurrently configuring input peripheral memory elements of the block in internal test mode and configuring output peripheral memory elements of the block in an external test mode during quiescent current testing of the circuit.

The layout of the circuit does not need to be hierarchical in order to apply the proposed hierarchical quiescent current test method of the present invention. However, if the layout of the circuit is hierarchical, the design hierarchy used for the layout will typically correspond to the top levels of the design hierarchy used for the test method.

Still another aspect of the present invention is defined as a method of performing quiescent current testing on an integrated circuit having at least one hierarchical logic block, each block having a block serial input, scannable memory elements arranged in at least one scan chain having a scan chain serial input, the method comprising connecting each block serial input to a circuit serial input and connecting each scan chain serial input to its associated block serial input; serially loading a quiescent current test pattern through the circuit serial input so as to load the test pattern into each scan chain in parallel until a predetermined reference point of the test pattern has been reached at which all scannable memory elements in the circuit have been initialized with a known value, and then performing a predetermined number of quiescent current measurement steps including: measuring the quiescent current of the circuit, storing the measured quiescent current value and the test pattern point at which the value was measured; and, while the predetermined number of measurements has not been reached, scanning in an additional sequence of bits of the test pattern and repeating the measurement steps.

BRIEF DESCRIPTION OF THE DRAWINGS

These and other features of the invention will become more apparent from the following description in which reference is made to the appended drawings in which.

DETAILED DESCRIPTION

In the following detailed description, numerous specific details are set forth in order to provide a thorough understanding of the present invention, However, it will be understood by those skilled in the art that the present invention may be practiced without these specific details. In other instances, well known methods, procedures, components and circuits have not been described in detail so as not to obscure aspects of the present invention.

As is known in the art, integrated circuit devices are typically designed and fabricated using one or more computer data files that define the layout of the circuit arrangements of the devices. The files are typically generated by a design tool and are subsequently used during manufacturing to create the layout masks that define the circuit arrangements applied to a semiconductor wafer. Typically, the programs are provided in a predefined format using a hardware description language (HDL) such as VHDL, verilog, EDIF, etc. While the invention has and hereinafter will be described in the context of fully functioning integrated circuit devices and data processing systems utilizing such devices, those skilled in the art will appreciate that the various embodiments of the invention are capable of being distributed as a program product in a variety of forms, and that the invention applies equally regardless of the particular type of signal bearing media used to actually carry out the distribution. Examples of signal bearing media include but are not limited to recordable type media such as volatile and non-volatile memory devices, floppy disks, hard disk drives, CD-ROM's, and DVD's, among others and transmission type media such as digital and analog communications links.

Figure 1:
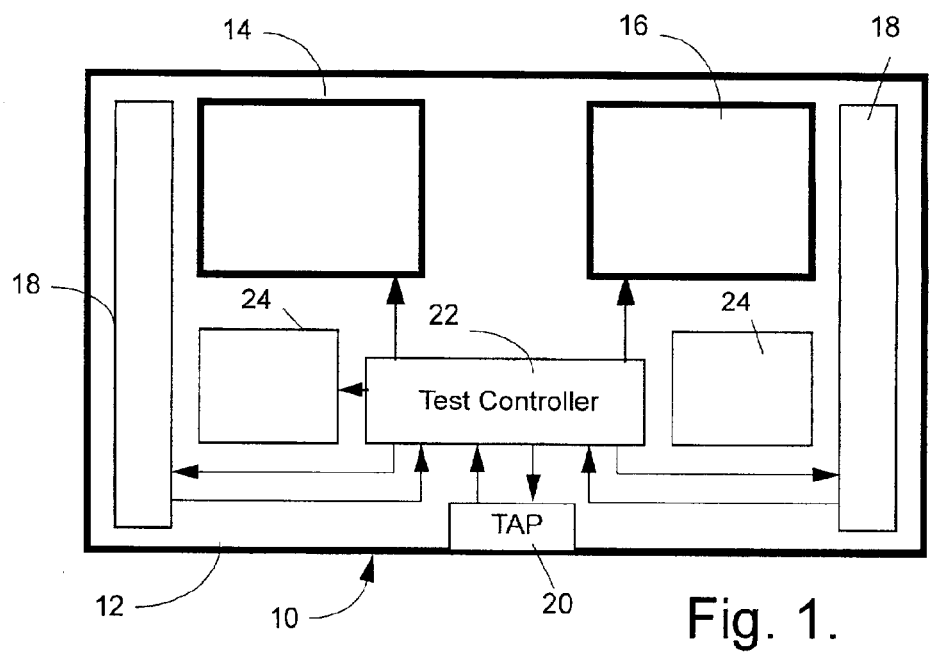
FIG. 1 is a diagrammatic block view of a circuit according to one embodiment of the present invention.

FIG. 1 illustrates a simple hierarchical circuit 10 according to one embodiment of the present invention. The circuit includes a top-level hierarchical block 12, two embedded hierarchical functional blocks 14 and 16, a boundary scan register 18, a Test Access Port (TAP) 20, and a test controller 22. Reference numeral 24 represents logic in top-level block 12. Blocks 14 and 16 are contained within or embedded in the top-level block and, thus, are located one level down in design hierarchy. Two hierarchical blocks are shown for illustration purposes only. It is to be understood that the circuit may have any arbitrary number of hierarchical blocks and levels. The TAP and boundary scan register are preferred, but not essential to the invention. Typically, blocks 14 and 16 provide a unique function. There may be several reasons why these blocks are partitioned from the main or host block, Some blocks may have been previously designed; others may have been obtained from a third party core provider; still others may be formed by encapsulating a large sub-circuit to simplify the design of the circuit.

Figure 2:
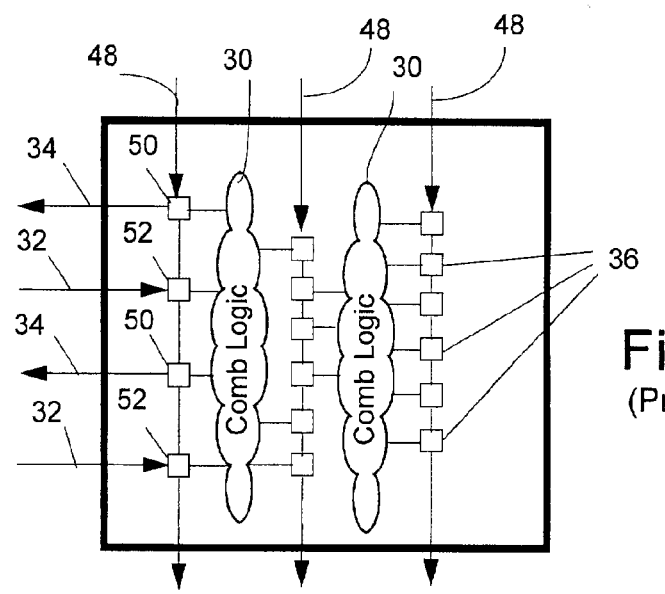
FIG. 2 is a diagrammatic view of a hierarchical block showing scannable memory elements arranged in scan chains and peripheral memory elements associated with block inputs and outputs.
Figure 3:
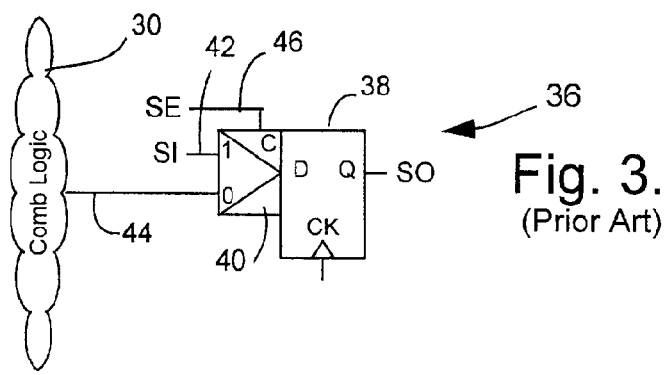
FIG. 3 diagrammatically illustrates a prior art scannable memory element.

FIG. 2 is a diagrammatic view of the internal structure of a typical hierarchical block. The block generally includes combinational logic 30 and block inputs 32 and block outputs 34, by which the block communicates with other blocks during normal operation of the circuit, and memory or storage elements 36 which store data during normal operation of the circuit as well as during various test modes of operation. The memory elements are designed to be scannable to allow a test stimulus to be scanned into the elements and a test response data to be scanned out. FIG. 3 illustrates one arrangement of a typical scannable memory element 36. The element receives input from combinational logic 30. The memory element includes a flip-flop 38 having a data input, D, a data output Q and a clock input, CK. Input D is connected to the output of a multiplexer 40. One input 42 of the multiplexer is connected to a memory element serial input, SI. The other input 44 of the multiplexer is connected to an output of combinational logic 30. A control input 46 of the multiplexer receives a scan enable signal, SE, which operates to configure the memory element in scan or shift mode when SE is active (logic 1) and in capture or normal mode when SE is inactive (logic 0). Output Q also serves as the memory element Serial Output, SO.

Referring again to FIG. 2, when scan enable SE is active, the scannable memory elements are serially interconnected into one or more scan chains 48 by connecting the serial output SO of each memory element to the serial input SI of another memory element. The serial input of the first memory element in the chain is connected to a scan chain serial input. The serial output of the last memory element in a scan chain is connected to a scan chain serial output. A scan chain segment is comprised of one or more memory elements.

Memory elements located at the periphery or boundary of a logic block are referred herein to as "peripheral memory elements", but also known in the art as "partitioning scan cells". Elements which output a signal from the block, such as memory elements 50, are output peripheral memory elements. Elements which receive a signal applied to the block, such as memory elements 52, are input peripheral memory elements. The preferred form of peripheral memory elements are of the type disclosed and claimed in Applicant's above mentioned co-pending U.S. application patent application Ser. No. 09/626,877 which uses functional memory elements to partition a block into an internal partition and an external partition and thereby provide module or block isolation. However, the present invention can be employed in a circuit which uses conventional test dedicated peripheral memory elements. Both forms of peripheral elements are described and illustrated in the aforementioned application.

Output peripheral memory elements are configurable in "external test mode" in which data contained in the memory element is applied to its associated block output node which, in turn, is connected to external circuitry. When the element is not in external test mode, data generated by the block is passed through to the output node. This allows test data to be scanned in to the output peripheral memory elements to test the response of external circuitry to various values of block outputs. Similarly, input peripheral memory elements are configurable in "internal test mode" in which data contained in the peripheral memory element is passed on to the internal circuitry of the block. When the element is not in internal test mode, data applied to its associated block input node is applied to the internal circuitry of the block. This allows test data to be scanned in to the input peripheral memory elements to test the internal logic of the block.

The top-level block need not necessarily be provided with peripheral memory elements. In this case, the boundary scan register chain can be used as a peripheral chain. However, this is not necessary because access to chip inputs and outputs is available. Peripheral memory elements may be included in the top-level block if the complete circuit may itself constitute a block which is embedded into another circuit.

Input and output peripheral memory elements are normally not active concurrently. In the present invention, however, the test controller is provided with circuitry (not shown) which responds to an active quiescent current test signal by applying a signal to input and output peripheral memory elements which concurrently configures input peripheral memory elements in internal test mode and output peripheral memory elements in external test mode. This configuration is referred to herein as a "peripheral memory element quiescent current test mode". This mode allows the peripheral memory elements to be arranged in a scan chain segment and a simplified model of embedded blocks to be substituted for the complete description of the block during analysis of a parent block, as explained more fully later in the description of the method of the present invention. In addition, it allows test data scan in to input and output peripheral memory elements to be concurrently applied to block internal logic as well as to logic external to a block.

One aspect of the present invention relates to the manner in which internal and peripheral memory elements are arranged into scan chains for use in loading quiescent current test patterns into the various hierarchical blocks in the circuit. In general, memory element segments of a block are arranged, in IDDq test mode, on a scan path which originates from or includes a block serial input. This is achieved by connecting segment serial input to: A) a block input, B) the serial output of another segment or C) the serial output of a segment located in an embedded block one level down in design hierarchy and by connecting the block serial input of embedded blocks to the block serial input A segment comprises one or more serially configurable scannable memory elements.

This configuration allows the use of a simplified or shell model of a block during a block analysis design phase, described later. The simplified model contains peripheral memory element segments and peripheral logic and additional files which describe the scan paths of the block and the scan paths of embedded blocks and allows for pattern generation. In this arrangement, some rules checking (e.g. scan path continuity) and verification/simulation is performed in an indirect manner in which other scan test modes are rules checked and verified/simulated and it assumed that the IDDq test mode is correct by construction. Thus, this general configuration does not place any restrictions on internal and peripheral segments.

This configuration also allows the use of simplified models which contain all scan paths and peripheral logic which, in turn, allows for a complete analysis including rules checking, pattern generation and verification (i.e. simulation). The configuration provides significant size reduction in the size of simplified models, but is not optimal.

Figure 4:
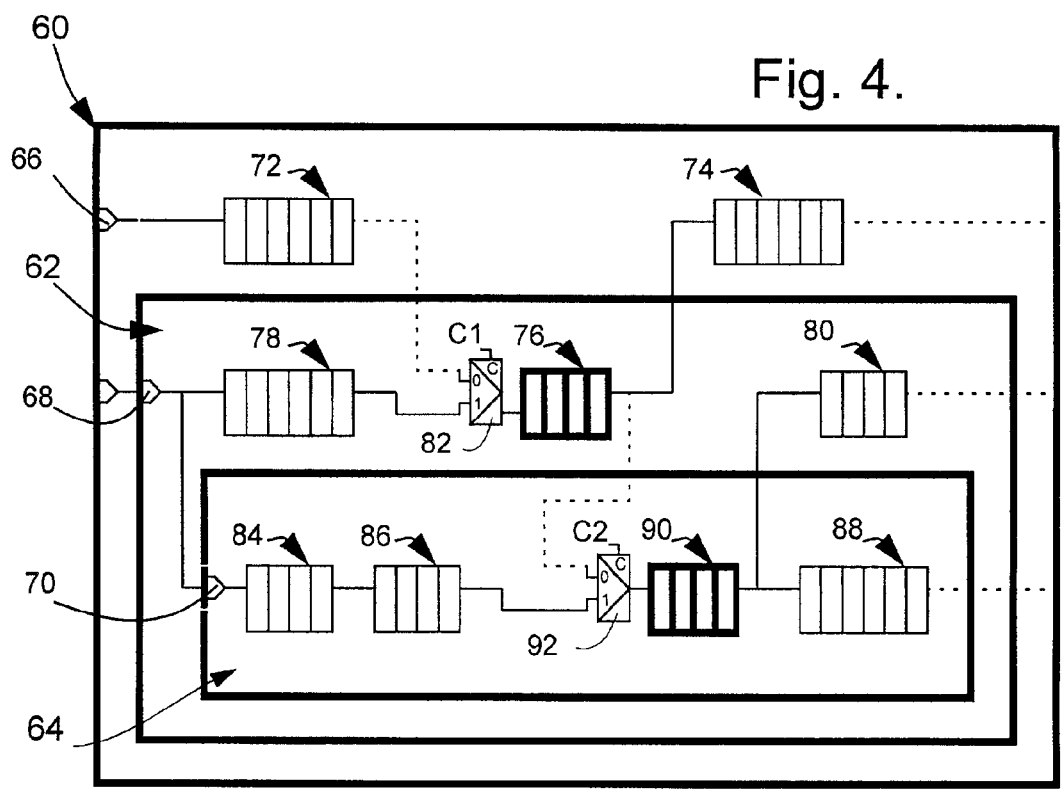
FIG. 4 diagrammatically illustrates a circuit having three levels of hierarchy and showing the manner in which scan chain segments may be connected according to one embodiment of the present invention.

This general configuration will be better understood by referring to FIG. 4 which illustrates a circuit having three levels of hierarchy. The figure shows three blocks including a top level block 60 having an embedded block 62 which defines a second level of hierarchy and which, in turn, has an embedded block 64 which defines a third level of hierarchy. Scan chain segments are shown as a sequence of rectangles which represent memory elements. Peripheral segments are bolded. A segment may consist of one or more scannable memory elements. Blocks 60, 62 and 64 are provided with block serial inputs 66, 68 and 70, respectively. For simplicity, each block is shown as having only one block serial input. However, more than one block serial input may be provided without departing from the spirit of the invention. Host block 60 includes two internal segments 72 and 74 and no peripheral segments. Segment 72 is connected to top level block serial input 66, the chip circuit input. Embedded block 62 includes two internal segments 76 and 80 and a peripheral segment 78. In this simple example, block 62 is provided with means, in the form of a multiplexer 82, for selectively connecting the serial input of peripheral segment 78 to one of two sources including the output of internal segment 76 of block 62 or to the serial output of internal segment 72 of parent block 60. Multiplexer 82 is controlled by a control signal Cl. The output of peripheral segment 78 is connected to the input of internal segment 74 of parent block 60.

Embedded block 64, which resides in the third level of hierarchy, has four segments, including internal segments 84, 86 and 88, and peripheral segment 90. Segments 84 and 86 are serially connected together, with the input of segment 84 being connected to block serial input 70. A multiplexer 92 receives the serial output of peripheral segment 78 in parent block 62 and the output of internal segment 86 and applies its output to peripheral segment 90. Multiplexer 92 is controlled by control signal C2. The serial output of peripheral segment 90 branches to internal segment 80 of parent block 62 and internal segment 88 of current block 64. It will be seen that all segments reside on scan path which originates from or includes a block serial input. The serial input of block 64 is connected to the serial input of parent block 62. Control signals C1 and C2 are mode signals which are used to define different scan chains configurations for scan testing and quiescent current testing of the circuit. A specific example of various modes is given below with reference to FIG. 5.

It will be seen that the general configuration described above allows segments which depend on internal segments of embedded blocks. In some cases, this can lead to complications with regard to generating and verifying test patterns to be used during quiescent current testing. The situation can be simplified by placing restrictions on the connections of internal and peripheral scan chain segments as described below.

In IDDq test mode, internal segments are arranged on a scan path which originates from or includes a block serial input by connecting the internal chain segment serial input to: A) a block input, B) the serial output of another segment (internal or peripheral) in the block or C) the serial output of a peripheral segment located in an embedded block one level down in design hierarchy. Thus, the primary difference between this configuration and the general configuration described above is with regard to the option (C). More specifically, if an internal segment is connected to any segment in an embedded block, it must be connected to the output of a peripheral segment.

Figure 5:
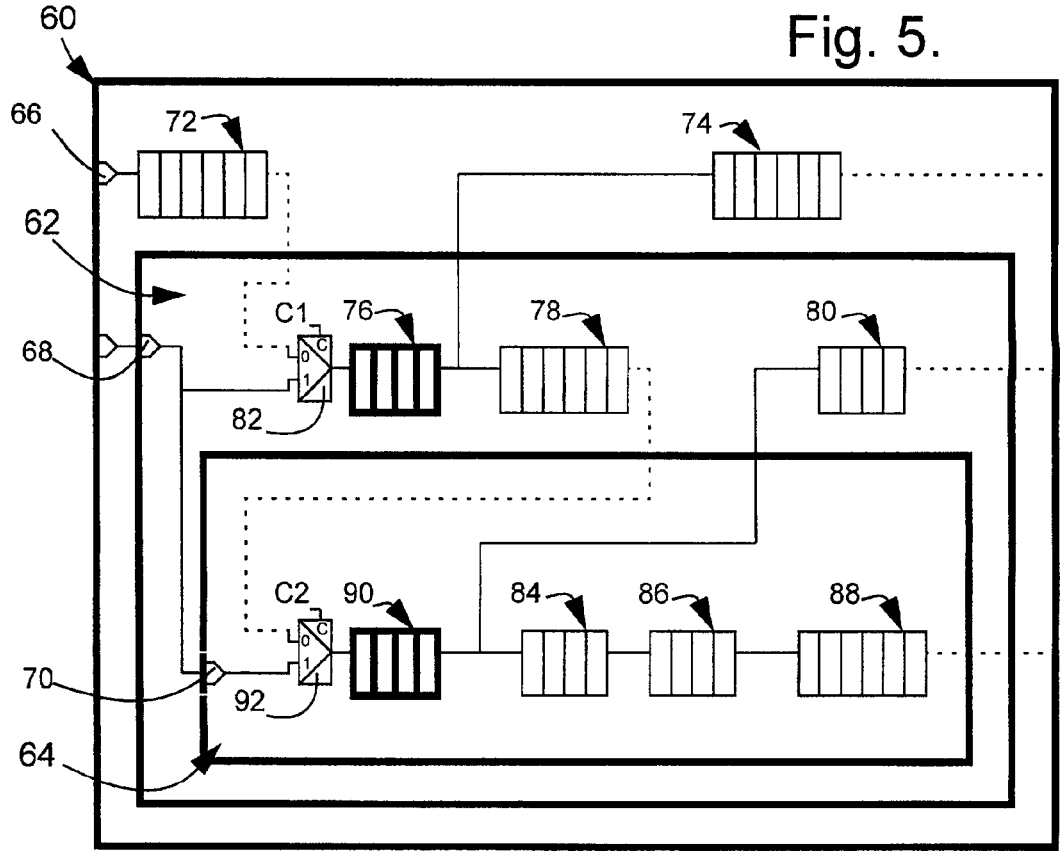
FIG. 5 is similar to FIG. 4, but shows a more restrictive manner in which scan chain segments may be connected according to a preferred embodiment of the present invention.

In IDDq test mode, peripheral segments are arranged on a scan path which originates from or includes a block serial input by connecting the peripheral segment serial input to: A) a block input, B) the serial output of another peripheral segment of the block or C) the serial output of a peripheral segment located in an embedded block. Thus, this limits the sources for peripheral segments to either the block serial input or to the output of another peripheral segment in its resident block or in an embedded block. This configuration is illustrated in FIG. 5 which has the same three blocks and scan chain segments as in FIG. 4 and uses the same reference numerals used in the latter to designate like parts. Referring to FIG. 5, it will be seen that internal segments 74 and 80 have their serial inputs connected to the output of segments in an embedded block. In both cases, the source is the output of a peripheral segment, namely segments 76 and 90, respectively. All other internal blocks are connected to other segments in their respective block. The circuit is in IDDq mode when control signals C1 and C2 are both active (logic 1). The scan chains which are formed in this mode are indicated by the solid lines which interconnect the various segments. The dotted lines indicate other scan test modes. Thus, it will be seen that, in IDDq mode for the FIG. 5 example, peripheral segments 76 and 90 are connected directly to their respective block serial input and are the first segment in their respective scan chains. In IDDq mode, the circuit of FIG. 5 has four chain chains which together collect all memory elements in the circuit. A first scan path comprises segment 72 in block 60; a second scan path comprises segments 76, 78, and 74; a third scan path comprises segments 84, 86, 90 and 80; and a fourth scan path comprises segments 90, 84, 86 and 88.

In addition to defining an IDDq mode, control signal C1 and C2, define three scan test modes which are used to test the three blocks individually. C1 and C2 are set to 0,0 to perform a scan test of top level block 60. The scan path formed collects segments 72, 78 and 74. C1 and C2 are set to 0,0 to perform a scan test of block 52. The scan path formed collects segments 76, 78, 90 and 80. C1 and C2 are set to [0,1] to perform a scan test of embedded block 64. The scan path formed collects segments 84, 86, 90 and 88. It will be noted that the scan chains for blocks 60 and 62 include the peripheral segment of their embedded blocks. It will be understood by those skilled in the art that other scan chains may be formed for other tests.

Figure 11:
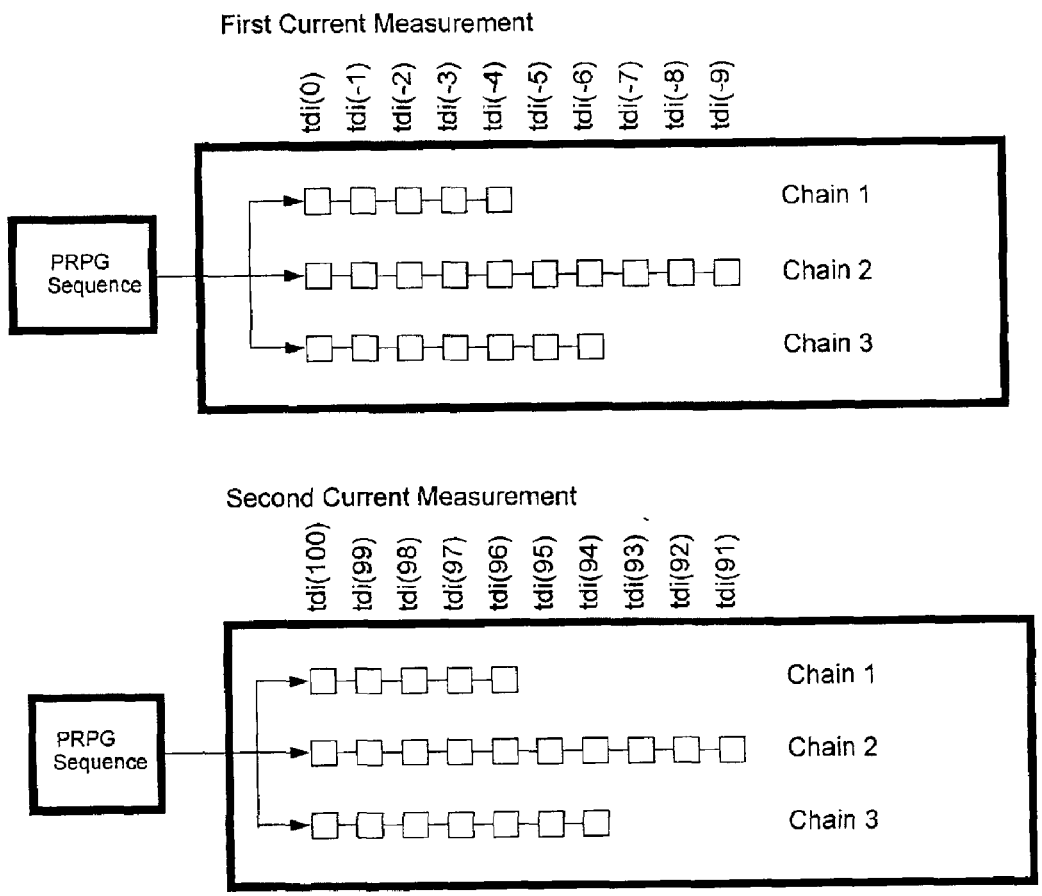
FIG. 11 diagrammatically illustrates the alignment of the serial input of three scan chain segments receiving the same quiescent current test pattern from a pseudo-random pattern generator.

The specific inter-block connections shown in FIG. 4 and 5 are for illustration purposes to show some possible connections. In the preferred form of the invention, each block, including the top level block, is provided with a single scan chain configuration which collects all scannable memory elements which reside in its block and the serial input of each scan chain is connected to the circuit serial input, the Test Data Input (TDI) of the TAP. This is illustrated in FIG. 11. This scan chain includes both internal and peripheral memory elements. All of the scan chains are concurrently enabled in response to a quiescent current test mode signal so that quiescent current test patterns can be concurrently loaded into all blocks in the circuit. Preferably, the same test patterns are concurrently loaded into all blocks and the patterns are pseudo random patterns. However, some blocks may require block specific patterns, as mentioned above. The serial input of such a block is connected to a separate source via a circuit primary input. The test patterns from the separate source are loaded into the block concurrently with the loading of test patterns into the other blocks.

Figure 6:
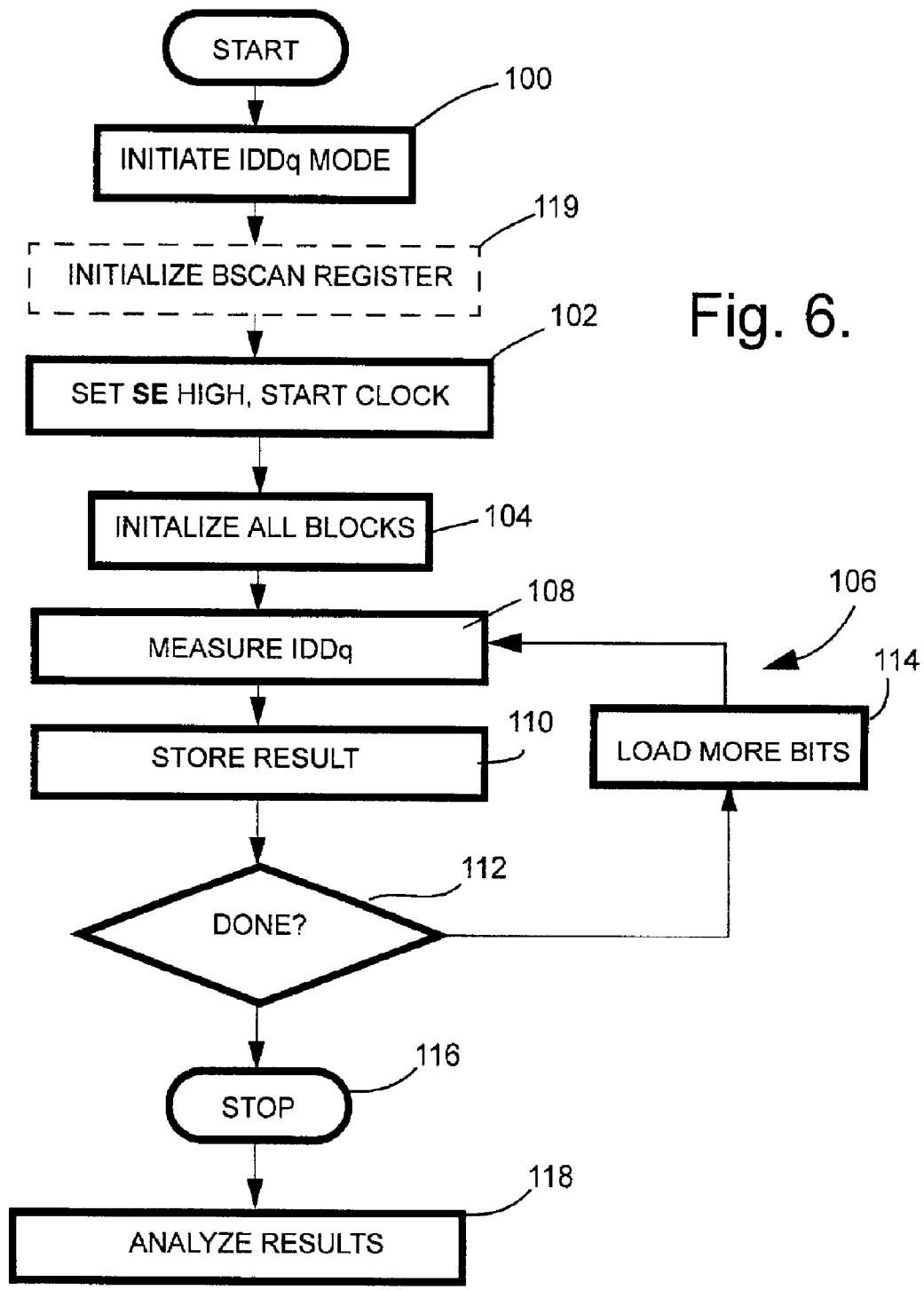
FIG. 6 is a flow chart illustrating the method of performing a quiescent current test on a circuit designed according to an embodiment of the method of design of the present invention.

A circuit constructed as described above may have quiescent testing performed as described below with reference to FIG. 6 which illustrates a flow chart of the various steps of the method. The circuit is placed in quiescent current test mode (step 100) by applying an appropriate instruction to the chip. In response, the test controller generates an appropriate Mode signal whereby the serial input of each block is connected to its predetermined circuit primary serial input, such as the TDI pin of the TAP, and the serial input of each block scan chain is connected to the block serial input. In the simplest form of the method, the serial input of blocks embedded in other blocks (i.e. blocks located at one level down in design hierarchy), are connected to the block serial input of their respective parent block. This establishes a scan path to all scannable memory elements in all blocks in the circuit and, more specifically, a plurality of parallel scan paths.

Quiescent current test patterns are then serially loaded through the circuit serial input(s) and into each scan chain in parallel until a predetermined reference point of the test pattern has been reached. This is achieved by setting SE high and activating the clock signal applied to the memory element clock inputs (step 102). The test patterns will include an initialization section which serve to initialize all memory elements to a known value (step 104). When the sequence of bits of the test pattern reaches a certain predetermined point, referred to herein as a "reference point", quiescent current measurement procedures, indicated generally by reference numeral 106, begins. Procedure 106 comprises performing a predetermined number of quiescent current measurement steps. These steps include measuring the quiescent current of the circuit (step 108), and storing the measured quiescent current value, and the test pattern point or number at which the value was measured (step 110). As long as the predetermined number of measurements have not been made (step 112), an additional sequence of bits of the test pattern is loaded (step 114) and the current measurement and storage steps 108, and 110, are repeated. When the predetermined number of measurements have been made, the procedure is terminated (step 116) and the results are analyzed using known methods to determine faults, if any, in the chip. In a preferred embodiment of the method, the test pattern is a pseudo-random sequence of bits.

The present invention also contemplates simultaneously loading different sequences of bits, from different sources, into different blocks as well as blocks have more than one quiescent current serial input for loading different sequences of bits into different scan chains of the same block.

Figure 12:
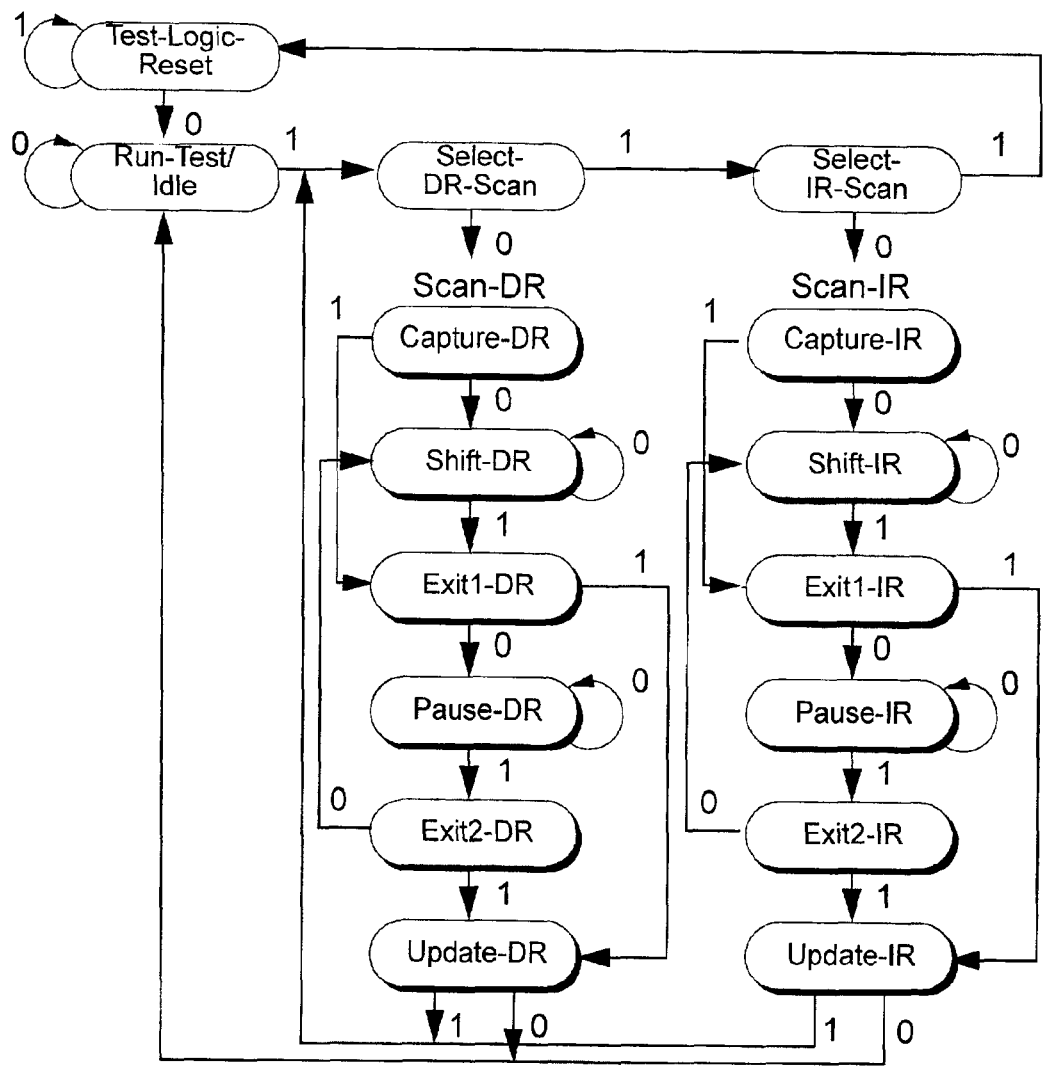
FIG. 12 is a state diagram of a Test Access Port according to the IEEE 1149.1 standard.

As mentioned, during testing, a scan enable signal and a clock signal are used to control scan path segments. The scan enable signal and clock signal can be applied directly to circuit inputs or to inputs of the TAP. When a TAP is provided and boundary scan is used in the top-level block, it might be necessary to scan predetermined values into the boundary scan register (step 119) prior to performing the IDDq measurement steps, to place circuit inputs and outputs in a condition that will not cause an elevated quiescent current. Referring to FIG. 12, which illustrates the various states of a TAP according to the IEEE 1149.1 standard, the scan enable signal is active during the Shift_DR state of the TAP and inactive when the TAP is in another state. Clock pulses are generated only during the Capture_DR and Shift_DR states of the TAP. The predetermined values are loaded into the boundary scan register by transitioning the TAP through the Select_DR, Capture, Shift, Exit1 and Update states. After shifting for an appropriate number of clock cycles, a measurement can be made while still in the shift cycle or, alternatively, by transitioning the TAP to the Exit1, Pause or Exit2 states. Going for the Pause or Exit states cause the scan enable (SE) signal to go low. This has the merit of testing the memory elements in their functional mode of operation. After a measurement has been made, step 114 (load more bits) is performed by transitioning back to the Shift state without traversing the Update state. This preserves the predetermined values loaded in step 119. In this way, once a test pattern has been shifted in, the current measurements are taken for various combinations of the scan enable and clock signals to maximize the fault coverage. This can also be achieved in a circuit which does not have a TAP.

The description now turns to the method of designing blocks to enable a circuit for quiescent current testing according to the present invention. As is evident from the foregoing, the quiescent current test method of the present invention employs a scan mode of operation by which quiescent current test patterns are shifted into memory elements of the entire circuit. The method is such that it is not only repeatable, but also predictable. The operations described below are performed on a description of a circuit under development.

It is assumed at the outset that functional memory elements in all blocks have been converted to scannable memory elements to include a multiplexer, such as multiplexer 40 in FIG. 3 so that the memory elements are configurable in scan mode and capture mode, and provision has been made to provide peripheral memory elements. Test dedicated memory elements may be inserted between the output of combinational logic of the block and the output node of the block. Alternatively, as described and claimed in Applicant's co-pending application, supra, functional memory elements at the periphery or boundary of each block are converted to peripheral memory elements. In the illustrated examples of FIGS. 1, 4 and 5, each of the blocks shown therein have been so modified.

The following steps are performed on selected blocks in the circuit. It will be understood by those skilled in the art that any sub-circuit may be selected or designated as a hierarchical block. Each selected block is provided with peripheral memory elements.

The first step is to arrange the internal scannable memory elements in each hierarchical block into scan chains according to the rules described earlier with reference to FIGS. 4 and 5 and to insert means in the circuit for concurrently configuring input peripheral memory elements in internal test mode and output peripheral memory elements in external test mode. These configurations are based on the principle that the test patterns generated for each block will be applied to the serial input of the block and that the block serial input is ultimately connected to a circuit serial input. This arrangement is necessary to determine a "reference point" of a predetermined sequence of bits applied to the serial input(s) when performing quiescent current measurements, as explained more fully later. This step is performed by an appropriate software tool which determines the appropriate scan chains from the circuit description using the above described segment connection rules.

Figure 7:
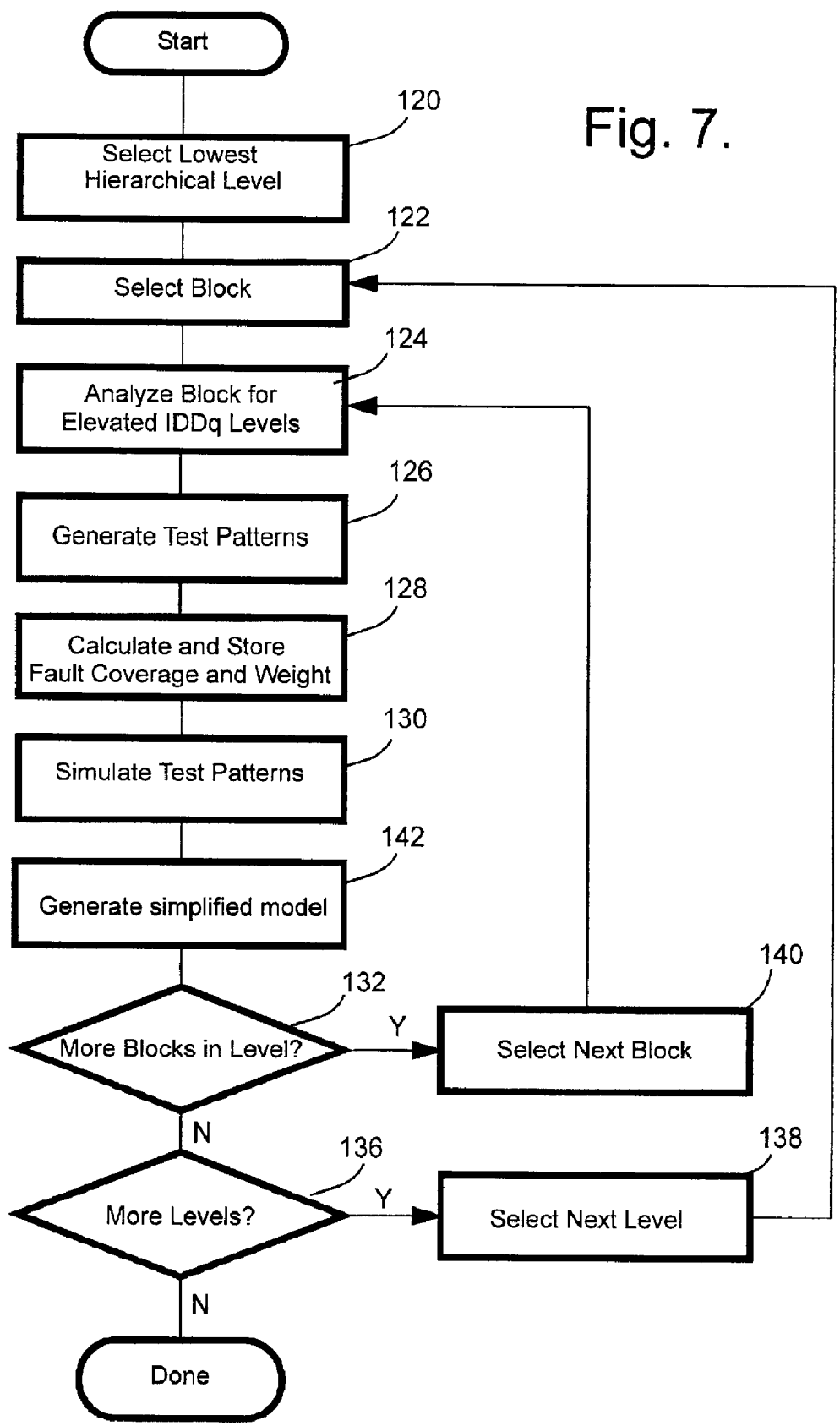
FIG. 7 is a flow chart generally illustrating a method of designing a hierarchical circuit for quiescent current testing according to an embodiment of the present invention.

Once the scan chain segments and chains in a hierarchical block have been defined and the block descriptions modified, each selected block is analyzed to determine whether there exist any circuit states which would cause an elevated quiescent current. As shown in the flow chart of FIG. 7, the analysis is performed on individual blocks in isolation. The analysis begins with the blocks at the lowest level of hierarchy and progresses upwardly to the highest level. This is referred to as a bottoms-up analysis. The circuit in FIGS. 4 and 5 will be used as an example. Thus, the lowest level is selected first (step 120) and then a block is selected (step 122) in the selected level. In the example, the lowest level is level three which has one block, block 64. Block 64 is selected . The block is then analyzed (step 124) to determine whether it contains circuit states which would result in elevated IDDq current levels. This is followed by the generation of test patterns (step 126) and the calculation of fault coverage (step 128) which is stored. Finally, the test patterns are simulated or verified (step 130). The patterns are fault simulated using any desired fault model such as a "toggle fault model" or a "pseudo stuck-at fault model", both of which are well known to those skilled in the art. If there are more blocks in the hierarchical level (step 132), the next block is selected (step 134) and steps 124 to 130 are repeated. In the illustrated example, there are no other blocks in the third level. If all blocks in the current level have been processed and there are more levels to analyze (step 136), the next level is selected (step 138) and steps 122 to 136 are repeated. In the example, the second level is processed and block 62 is selected for analysis. Once block 62 has been analyzed, the top level is processed and top level block is selected for analysis. When all levels have been processed, the procedure is complete. The above steps will now be described in more detail.

When analyzing the circuit description (typically, a gate level description) of an individual block during the design process, quiescent current test patterns are generated and applied to the logic within the block and to the logic at the next level down of design hierarchy via the peripheral memory elements of the blocks selected for analysis. Embedded blocks located one level down in design hierarchy, if any, are configured in peripheral memory element quiescent current test mode.

Preferably, a simplified or shell model of selected embedded hierarchical blocks is generated for use during analysis of its parent block. The simplified model is substituted for the complete description of the embedded block. This substitution simplifies the analysis. Simplified models need not be generated for all embedded blocks, but rather may be limited to certain blocks, such as blocks which exceed a predetermined size. The simplified model may contain only the peripheral scannable memory elements or, additionally, some peripheral logic, as described and claimed in Applicant's aforementioned application Ser. No. 09/626,877. Further particulars of the analysis procedure are described below in the description of variations of the method which are used for different types of blocks. The analysis is performed using the same test patterns which will be used during actual testing of the circuit and will identify test patterns which must be excluded.

For a block which contains embedded blocks, the fault coverage of the block is first calculated by considering only the logic contained within the block itself and the peripheral logic of embedded blocks located at one level down in the design hierarchy. The total fault coverage of the block is calculated by determining the weighted sum of the fault coverage of the block and of its embedded blocks. The fault coverage block is weighted by the number of gates contained in each block. It will be noted that the fault coverage of an embedded block can itself be the result of a weighted sum because of embedded blocks that are further down in the design hierarchy.

The simulation or verification of the application of the test patterns to verify their correctness, is optional in a design environment in which the connections of the various scan segments are automated. However, it might be desirable to perform such simulation in a circuit simulator (e.g. Verilog or VHDL) with full timing information to ensure that the circuit will operate as predicted.

The steps of analysis, test pattern generation and fault simulation are performed on a circuit representation which includes only the boolean function of circuit gates. Timing considerations are not taken into account. The simulation consists of scanning in the test patterns and observing that the desired bit values have been loaded in the correct memory elements at the predicted time. The simulation can be performed either by simulating the entire circuit, i.e. all blocks, simultaneously, or by simulating the host circuit and a simplified model of each of its embedded blocks. When a simplified model is used for embedded blocks, the most efficient way of organizing the scan path segments inside the embedded blocks is to connect all peripheral scan path segments to a block input or to the output of another peripheral scan path segment so that all peripheral memory elements are at the beginning of the scan path segments and the simulation results of a block do not depend on values shifted through internal scan path segments. Verification can also be performed in a fully hierarchical/manner.

As mentioned above, certain steps of the methods of designing differ slightly from one another, depending on the nature or type of block. The following description addresses these variations. There are two variations of the basic method that will be described. Both variations rely on the application of a standard predetermined sequence of bits to the serial inputs of blocks. Preferably, all blocks have a single serial input so that all blocks can be connected to the same test pattern source. The first variation is based on the premise that test patterns do not need to be carefully chosen and that, in a good circuit, no circuit states result in elevated quiescent current. The second variation is based on the premise that test patterns do not need to be carefully chosen and that, in a good circuit, most circuit states will not result in elevated quiescent current. Thus, this variation contemplates that some states result in an elevated quiescent current and includes steps to identify test patterns which create elevated quiescent current conditions.

First Variation

As previously mentioned, the first variation is based on the premise that test patterns do not need to be carefully chosen and that, in a good circuit, no circuit states will result in an elevated quiescent current. This variation allows a block provider to perform all steps necessary to prepare a block for quiescent current testing, according to the present invention, without having to provide detailed information about the internal structure of the block to the user of the block.

Both variations use predetermined sequences of bits that are not block specific. The same sequence of bits is applied to the serial input of all blocks of these types. The sequence is preferably a pseudo-random sequence, but it can be any sequence as long as it is extendable, both forward and backward, from a "reference point", so that all of the memory elements of the longest chain are initialized. A pseudo-random sequence is preferred because of the ease with which it can be to generated algorithmically either on-chip or off-chip. Test pattern generation can be implemented by means of either hardware or software. Predetermined sequences can also be stored in tester memory as well.

The analysis phase determines whether certain circuit states result in elevated quiescent current. In the first variation of the method, the result of the analysis must indicate that there are no such states. An indication that there are such states means that there is an error in the design of the block and the error must be rectified. The analysis can be a static analysis performed independently of the aforementioned predetermined sequence of bits which will applied to the serial inputs during quiescent current testing of the circuit. A static analysis assumes that all circuit states are possible. While the analysis is more complex than other types of analyses, it is exhaustive in that it can verify that any predetermined sequence can be applied to the circuit. The analysis may, alternatively, consist of a simulation of the logic contained in the block using the predetermined sequence of bits applied to the block serial input during actual quiescent current testing. While a simulation analysis is simpler than a static analysis, it is not exhaustive in that the results obtained with a specific sequence are not necessarily applicable to other sequences.

The quiescent current test pattern for the circuit is designed so that it includes an initialization section and a quiescent current measuring section. The initialization section serves to initialize all scannable memory elements in the circuit to a known value. A "reference point" in the predetermined sequence is the point at which quiescent current measuring begins. Assuming a single serial input for each block (the case of multiple serial inputs is discussed later) and a maximum chain length L, the L bits of the predetermined sequence preceding the reference point must be known as these bits will determine the contents of the scan chain.

Starting from the reference point of the predetermined sequence, the test patterns resulting from shifting the predetermined sequence are calculated and the fault coverage is calculated for each of a predetermined number of current measuring points after the reference point of the predetermined sequence. The measuring points are the same for all blocks and can be at regular intervals of the predetermined sequence. By aligning the reference point, i.e. by concurrently loading the same test pattern into all quiescent current scan paths in all blocks, it is possible to perform the analysis of each block in isolation without knowing anything about the other blocks. The procedure to generate the test pattern for each block is performed in such a way that it will be possible to apply the patterns after the block has been inserted on a chip. The procedure is as follows. A Pseudo Random Pattern Generator (PRPG) sequence (see FIG. 11) is applied with a constant, predetermined polynomial and seed to all blocks. The PRPG seed corresponds to the PRPG value at the time the first current measurement is performed. Subsequent current measurements are performed at predetermined intervals, such as every 100 clock cycles for as many current measurements as are desired. Depending on the length of the scan chain of a given block, the PRPG is rolled back by N states to determine the starting seed value to load in the PRPG and begin generating the sequence for the block. N corresponds to the length of the scan chain. This approach of aligning the seed at the first measurement instead of at the beginning of the sequence allows aligning the sequence for multiple blocks which have different scan chain lengths. The longest sequence is chosen so that all blocks end up in the same predicted state at the time of the first (the reference point of the sequence) and the subsequent current measurements. Extra TDI values are simply flushed out at the other end for the smaller scan chains.

The first measurement corresponds to the reference point mentioned previously. At the time of the first measurement, the first memory element of all chains contains a value corresponding to TDI timeslot 0. The next memory element contains TDI timeslot −1 and so forth. The same predicted values apply to subsequent measurements and is independent on the length of each scan chain.

When the various blocks are integrated into a circuit, the block with the longest chain will determine the length of the initialization section, i.e., the number of bits which must be provided before the reference point to completely initialize all chains. For example, assume that block 14 has a scan chain length of 30,000 and block 16 has a chain length of 50,000. Block 14 is analyzed using only the 30,000 bits before the reference point to initialize all memory elements. Block 16 is analyzed using the 50,000 bits before the reference point. When the circuit is actually tested, the 50,000 bits before the reference point are applied to the circuit to initialize the longest chain. However, the first 20,000 bits will be ignored by block 14 as it only needs the last 30,000 bits. The last 30,000 bits will correspond exactly to those used to perform the analysis of block 14 in isolation and the 50,000 bits will correspond exactly to those used to perform the analysis of block 16 in isolation.

From the reference point, current measurements are performed every time a certain number of new bits of the sequence have been shifted in. This number is arbitrary. However, a standard number can be used so that the fault coverage can be computed in advance for all blocks. For example, a measurement interval of every 100 bits of the predetermined sequence would be acceptable.

The analysis of the blocks is bottom-up. That is, the blocks at the lowest level of the design hierarchy are analyzed first and the information necessary to analyze the block at the next higher level of hierarchy is generated and stored. The information would include, for example, the values output by the output peripheral memory elements.

Generally, blocks will have only one block serial input. However, more than one block serial input may be provided if desired without departing from the invention. The advantage of using several serial inputs is that it might reduce the test time because it takes less time to load the scan paths. However, the dominant factor is usually the time required to perform the current measurement as opposed to the time required to load the patterns. Multiple serial inputs would only be required when the scan chain length of a block is very large (e.g. more than a million memory elements). Individual scan chains in the block would be connected to only one of the block serial inputs.

The same predetermined sequence of bits can be applied to all inputs or, alternatively, different sequences can be applied to different inputs. The use of different sequences for different serial inputs might provide a slightly higher fault coverage. The use of the same sequence for all serial inputs simplifies the connections. This is because, if each serial input is associated with a specific predetermined sequence, the connections made at the next level of design hierarchy must take this association into account. The same predetermined sequences are used for all embedded blocks. That is, serial inputs of different blocks can be connected together. In this variation, the analysis requires only one pass through the various blocks of the circuit.

Figure 8:
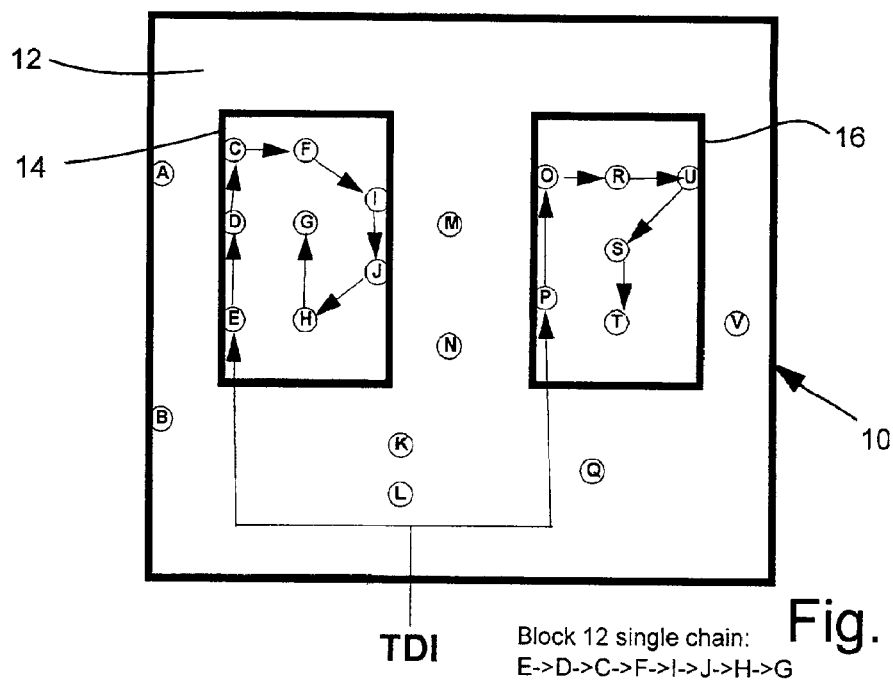
FIG. 8 is a diagram illustrating a single scan chain configuration for two hierarchical blocks located one level down in design hierarchy from a parent or host block.
Figure 9:
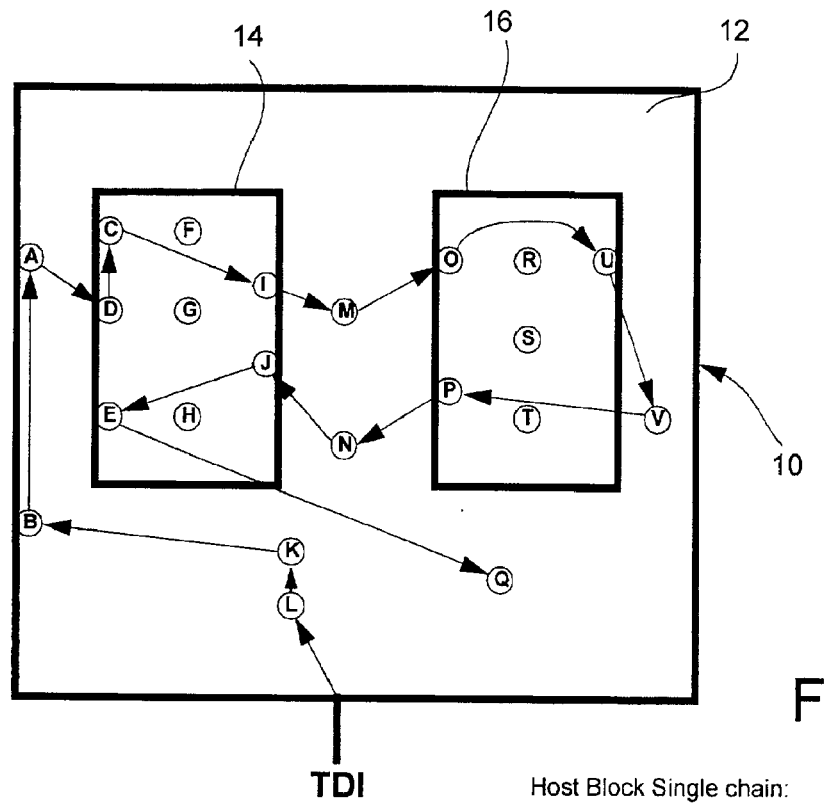
FIG. 9 is a diagram similar to FIG. 8, but illustrating a parent block scan chain configuration which includes all scannable memory elements of the parent or top-level block and the peripheral memory elements of two hierarchical block located one level down in design hierarchy.
Figure 10:
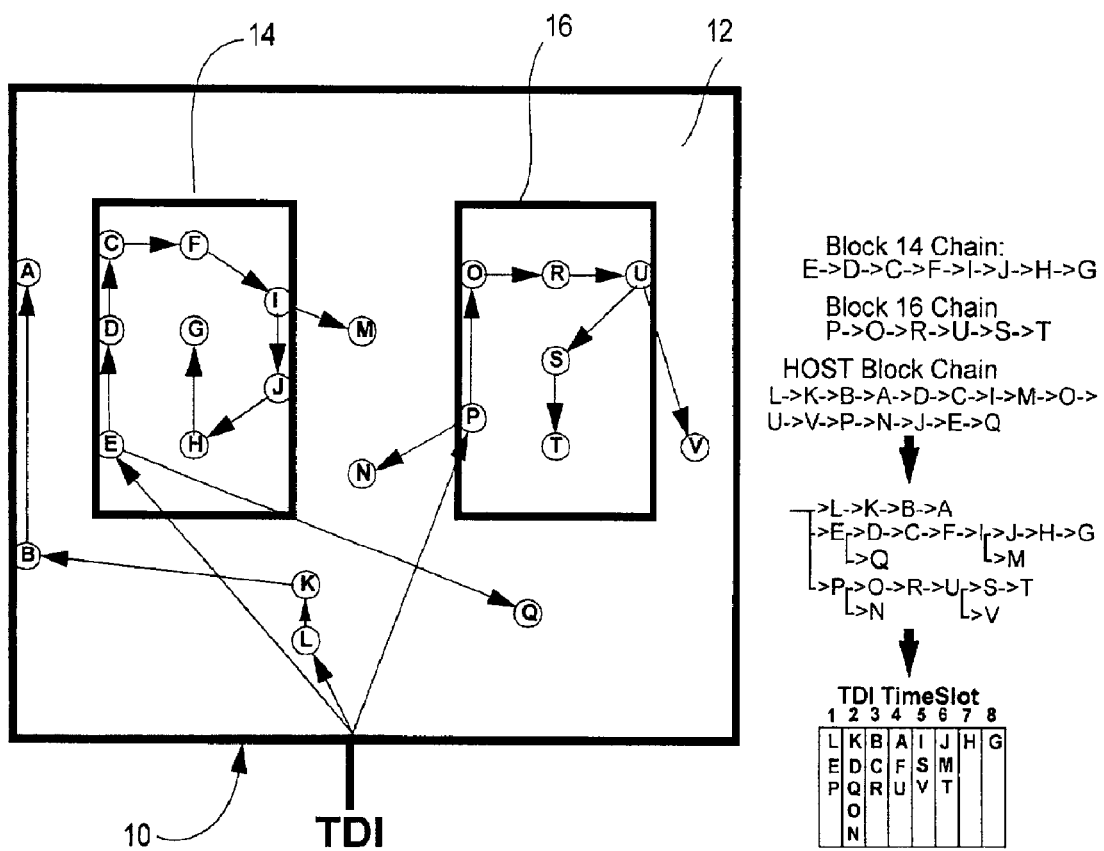
FIG. 10 is a diagram similar to FIG. 8, but illustrating a single scan chain configuration for each of a host block and two hierarchical blocks located one level down in design hierarchy, which is used when performing a quiescent current test of the circuit.

FIGS. 8–10 illustrate scan chain configurations which are obtained in accordance with the present invention. The three figures illustrate different scan chain configurations for the same circuit. Scan chain segments are indicated by an alphabetical character inside a circle. Segments positioned adjacent the perimeter of a block are peripheral memory elements. The arrows indicate scan path shift direction. Each figure shows the circuit 10 as having a Test Data Input pin, TDI, which serves as the circuit as well as the block serial input for quiescent current test patterns.

Referring to FIG. 8, host block 12 comprises segments labeled A, B, K, L, M, N, Q, V. Block 14 consists of segments C, D, E, F, G, H, I and J. Block 16 comprises segments O, P, Q, R, S, T and U. A single scan chain configuration is shown for each block. The first segment of each single chain is connected to the TDI pin, which is the serial input of the host block. The single scan chain of each block collects all memory elements within its associated block, including both the internal and peripheral memory elements. The order of the memory elements in each segment is extracted for each block separately and stored in a respective block scan chain file in memory.

FIG. 9 illustrates a single chain configuration which is used when a host or parent block 12 is selected for analysis. The single scan chain of the top level block collects all top level memory elements and the peripheral memory elements of collared or embedded hierarchical blocks 14 and 16.

FIG. 10 illustrates the scan configuration that is obtained when both embedded blocks 14 and 16 and the top level block 12 are placed into their respective single chain configuration. It will be seen that, in this configuration, all memory elements in all blocks have been collected. This is the scan chain configuration which is used when a quiescent current testing is performed on a physical chip and when the entire chip is analyzed at once. It will be noted that certain peripheral memory elements within hierarchical blocks 14 and 16, drive two destinations. For example, memory element U drives memory elements S and V. This type of scan chain branching is normally not allowed in scan based tests, but does not create any problems in quiescent current testing because the scan chains are only used to control the states of the memory elements, but not to observe them. Observation in a quiescent current test is achieved by current measurements, not by comparing the scanned out values of the memory elements. The other point to note is that the value of V depends on the value of internal segment R. The only information required about this segment is its length. This information is extracted during the analysis of embedded block 16 and can be made easily available during the analysis of parent block 12.

As with a normal scan chain, the position of each memory element in the scan chain is associated to a "timeslot" on TDI except that, due to the branching effect, more than one memory element can be associated with any given timeslot. The consequence of the branching is that values within memory elements are forced to be the same for all memory elements associated with a unique timeslot on TDI. This avoids loading of independent values in each hierarchical block. The random vector method described herein exploits this feature and allows for fault grading each block independently of all other blocks while obtaining a consolidated fault coverage of the entire chip without ever having to load the entire netlist into any analysis tool.

When performing the analysis of this circuit, blocks 14 and 16 are analyzed before host block is analyzed. Being in the same hierarchical level, the order in which blocks 14 and 16 are analyzed is not important.

Second Variation

The second variation is based on the premise that test patterns do not need to be carefully chosen and that, in a good circuit, most, but not all, circuit states will not result in elevated quiescent current. Thus, this variation assumes that there may be some states which result in an elevated quiescent current. In contrast with the first variation, the second variation is most useful when the circuit designer has access to detailed information respecting all hierarchical blocks because a fault simulation must be performed on the hierarchical blocks after the blocks have been assembled on the circuit. The method identifies test patterns which result in elevated quiescent current states and excludes them from use during analysis and quiescent current testing of the circuit.

In this variation, analysis of the circuit is performed in two passes. Each pass are performed bottom-up, i.e. from the lowest level of design hierarchy to the highest level. The first pass identifies the points of the sequence where current measurements can be performed. The second pass calculates fault coverage based on the portion of the sequence that were actually used.

During the first pass, starting with the blocks at the lowest level of design hierarchy, each block is analyzed and a set of constraints is appended to information passed to the next level of design hierarchy. The constraints identify the points of the sequence which correspond to elevated quiescent current and also specify test pattern information. The constraint information can be appended to a log file produced by an analysis tool. The analysis at the next higher level considers the constraints of all embedded blocks and excludes all points of the sequence where at least one block indicated that it corresponded to an elevated quiescent current. This new set of constraints is stored for use in the analysis in the next higher level of design hierarchy where additional points may be excluded based on the analysis at that level. Once the top and final level block has been analyzed, all usable, or non-usable, points of the sequence have been identified.

During the second pass, test patterns corresponding to the usable points of the sequence are fault simulated and the fault coverage is calculated. Again, the blocks at the lowest level of hierarchy are analyzed first and the fault coverage results are stored for use in the next higher level of design hierarchy along with the number of gates in the block so that the total fault coverage of the next higher level can be calculated.

All the connections indicated in the description in the claims are "logical" connections meaning that the connections are made during the test mode of interest (i.e. quiescent current measurements). This means that the connections could be made through logic (e.g. multiplexers or other gates) as opposed to direct connections.

Although the present invention has been described in detail with regard to preferred embodiments and drawings of the invention, it will be apparent to those skilled in the art that various adaptions, modifications and alterations may be accomplished without departing from the spirit and scope of the present invention. Accordingly, it is to be understood that the accompanying drawings as set forth herein above are not intended to limit the breadth of the present invention, which should be inferred only from the following claims and their appropriately construed legal equivalents.

We claim:

1. A method of implementing quiescent current testing capabilities into an integrated circuit having at least one hierarchical block, comprising:

analyzing each of one or more selected hierarchical blocks independently of other selected blocks in the same or higher levels of hierarchy to identify circuit states of each said selected blocks which could result in elevated quiescent current levels during quiescent current testing of said circuit;

said analyzing beginning with a selected block at a lowest level of hierarchy and proceeding in sequence through each level of design hierarchy to a highest level of hierarchy containing a top-level block; and calculating a fault coverage for each said selected blocks.

2. A method as defined in claim 1, said analyzing further including:

substituting a simplified model of any embedded selected blocks located one level down in design hierarchy in place of a complete description of said embedded selected blocks; and determining the number of gates in said selected block, said calculating a fault coverage for each said selected blocks including calculating a weighted sum of the fault coverage of said selected block and of said embedded selected blocks.

3. A method as defined in claim 2, said weighted sum of the fault coverage being based on the number of gates in said selected block and each said embedded selected blocks.

4. A method as defined in claim 2, said analyzing including:

generating sequences of bits for all scannable memory elements in said selected block and peripheral memory elements in any embedded selected blocks, assigning said bits to said scannable memory elements and to peripheral memory elements of said embedded selected blocks located one level down in design hierarchy, and determining whether the generated sequence of bits results in an elevated quiescent current state.

5. A method as defined in claim 1, said analyzing further including determining and storing a block initializing sequence of bits to be applied to said selected block prior to performing quiescent current testing of said circuit.

6. A method as defined in claim 1, further including, prior to said analyzing, arranging each scan chain segment of a selected block on a scan path which includes a serial input of said selected block.

7. A method as defined in claim 6, further including configuring scannable memory elements into scan chain segments comprising connecting all scannable memory elements of said selected block into a single scan chain segment.

8. A method as defined in claim 1, further including performing a fault simulation of said circuit using quiescent current test patterns obtained in said analysis.

9. A method as defined in claim 1, said analysis including:
generating test patterns for a selected block using a simplified model of embedded selected blocks in place of a complete description of said embedded selected blocks; and
calculating the total fault coverage for said selected block by calculating the weighted sum of the fault coverages of said selected block and said embedded selected blocks one level of design hierarchy down.

10. A method as defined in claim 9, said calculating the total fault coverage including using a pseudo stuck-at fault coverage model or a toggle fault coverage model.

11. A method as defined in claim 9, said at least one or more selected hierarchical blocks including a top-level logic block.

12. A method as defined in claim 11, said peripheral memory elements being omitted from said top-level block.

13. A method as defined in claim 1, said analyzing including performing a static analysis of a selected block for determining whether an elevated current can result from any of the circuit states.

14. A method as defined in claim 13, said analyzing further including performing a fault simulation of logic contained in a selected block using a predetermined sequence of bits applied to said serial inputs as the only source of input stimulus.

15. A method as defined in claim 14, said performing a fault simulation including applying a different sequence of bits to each selected block serial inputs.

16. A method as defined in claim 14, said performing a fault simulation including applying the same sequence of bits to each selected block serial inputs.

17. A method as defined in claim 14, said performing a fault simulation including initializing all memory elements of said selected block to values contained in an initialization section of said predetermined sequence of bits immediately preceding a predetermined reference point of said predetermined sequence of bits and performing said fault simulation using values of said predetermined sequence including and/or following said predetermined reference point.

18. A method as defined in claim 17, said performing a fault simulation including using the same predetermined reference point in a fault simulation of all of said selected blocks.

19. A method as defined in claim 18, said analysis being performed for each of a predetermined number of points following said predetermined reference point of said predetermined sequence of bits.

20. A method as defined in claim 19, further including using the same predetermined number of points for analyzing all selected blocks.

21. A method as defined in claim 20, said predetermined number of points being at spaced intervals in the predetermined sequence of bits.

22. A method as defined in claim 21, said predetermined sequence of bits being a pseudo-random sequence of bits.

23. A method as defined in claim 22, said analyzing including producing an analysis summary including reporting at least the number of gates of a selected block and the cumulative fault coverage of each said points after the reference point of said predetermined sequence of bits.

24. A method as defined in claim 23, further including determining said cumulative coverage by calculating the weighted sum of the cumulative coverage of said selected block using a simplified model of embedded selected blocks located at the next level down of design hierarchy and the cumulative coverage of said embedded selected blocks.

25. A method as defined in claim 1, said performing an analysis of a selected block including performing said analysis in two passes, each pass beginning at the lowest level of hierarchy and ending at the highest level, a first of said passes identifying points of a predetermined sequence of bits at which quiescent current measurements can be performed and a second of said passes calculating the fault coverage based on the points of said predetermined sequence identified in said first pass.

26. A method as defined in claim 25, said first pass including, starting with blocks at the lowest levels of design hierarchy, analyzing a selected block and storing a set of constraints indicating the points of said predetermined sequence which corresponds to elevated quiescent current and test pattern information, said analysis considering constraints of all embedded selected blocks and excluding analysis of any points of the sequence at which at least one block indicated an elevated quiescent current.

27. A method as defined in claim 26, said second pass including, for each said selected block, fault simulating test patterns corresponding to usable points of said predetermined sequence, determining the number of gates in the selected block, calculating a fault coverage and storing the number of gates and fault coverage.

28. A method as defined in claim 1, further including, prior to said analyzing:
converting all functional memory elements in said circuit into scannable memory elements;
converting memory elements at the boundaries of each selected block to peripheral memory elements in which input peripheral memory elements are selectively configurable in internal test mode and output peripheral memory elements are selectively configurable in external test mode;
arranging memory elements into single scan chain configuration for each block;
providing means for configuring peripheral memory element scan chain segment in quiescent current test mode in which input peripheral memory elements are configured in internal test mode and output peripheral memory elements are concurrently configured in external test mode; and
providing a quiescent current scan chain configuration in which the single scan chain configuration of each selected block is active.

29. A method as defined in claim 1, further including prior to said analyzing, for each of said one or more selected blocks:
arranging each scannable memory element scan chain segment of the selected block on a scan path which includes a serial input of said selected block by connecting a serial input of the segment to:
said selected block serial input, a serial output of another segment or a serial output of a segment in an embedded selected block located one level down in design hierarchy;

connecting a block serial input of any selected blocks embedded in said selected block to said block serial input; and providing means in said circuit for concurrently configuring input peripheral memory elements in internal test mode and output peripheral memory elements in external mode.

30. A method as defined in claim 1, further including inserting means in said circuit for configuring peripheral memory elements in a quiescent current mode during quiescent current testing of said circuit so that quiescent current test patterns loaded into said peripheral elements are applied to internal logic blocks and external logic blocks simultaneously.

31. A method as defined in claim 29, said arranging scan chain segments further including:

arranging internal segments in said selected block on a scan path which originates from a serial input of said selected block by connecting the serial input of said segment to:

a block serial input;

a serial output of another segment; or a serial output of a peripheral segment located in an embedded block; and arranging peripheral segments in said selected block on a scan path which originates from a block serial input by connecting the serial input thereof to:

a block serial input, a serial output of another peripheral segment in said block; or a serial output of a peripheral segment located in an embedded block.

32. A method as defined in claim 29, each said segments comprising one or more scannable memory elements.

33. A method as defined in claim 29, for each said selected block, arranging internal and peripheral scan chain segments therein into a single scan chain.

34. A method of performing quiescent current testing on an integrated circuit having quiescent current testing capabilities incorporated therein according to the method of claim 29, each selected block having a block serial input and scannable memory elements arranged in at least one scan chain, said method comprising:

connecting each said block serial input to a circuit serial input and connecting each said scan chain serial input to its associated block serial input;

serially loading a predetermined block initialization sequence of a quiescent current test pattern into a circuit serial input and into each said scan chain in parallel until a predetermined reference point of said test pattern has been reached, said initializing sequence being operable to initialize all scannable memory elements in said circuit with a known value; and performing a predetermined number of quiescent current measurement steps including:

measuring the quiescent current of said circuit; and while said predetermined number of measurements steps has not been performed, loading an additional sequence of bits of said test pattern into each scan chain and repeating said measurement steps.

35. A method as defined in claim 34, said performing a predetermined number of quiescent current measurement steps further including storing a measured quiescent current value and a test pattern point at which quiescent current value was measured.

36. A method as defined in claim 34, said performing a predetermined number of quiescent current measurement steps further including comparing a measured quiescent current value to a predetermined value.

37. A method as defined in claim 34, further including, for a circuit having a test access port and a boundary scan register, said method further including, prior to said loading a quiescent current test pattern:

loading a predetermined value into said boundary scan register to place circuit inputs and outputs in a condition that will not cause an elevated quiescent current.

38. A method as defined in claim 37, said a test access port having a capture state, a shift state and an update state, said boundary scan register comprised of a boundary scan cells associated with circuit inputs and outputs, and each said cell having a shift register element and an associated update latch element, said loading a predetermined value comprising loading said value into each said update latch elements using said shift and update states of said test access port to place circuit inputs and outputs in a condition that will not cause an elevated quiescent current; and said loading a predetermined block initialization sequence comprising loading said sequence using said shift state and not using said update state of said test access port so as to preserve said predetermined values in said update latches.

39. A method as defined in claim 34, said test pattern being a pseudo-random sequence of bits.

40. A method as defined in claim 34, said test pattern being the same for all block serial inputs.

41. A method as defined in claim 34, said test pattern being different for selected different block serial inputs.

42. A method as defined in claim 34, further including, for a hierarchical block having two or more scan chain serial inputs, connecting each said serial input to its associated block serial input so that said test pattern is loaded in parallel into each said two or more scan chains.

43. A method as defined in claim 34, said quiescent current test pattern including two or more predetermined sequences of bits associated with two or more corresponding circuit serial inputs, said connecting said block serial inputs including connecting each said block serial input to one of said two or more circuit serial inputs; and each said loading step including concurrently loading said two or more predetermined sequences of bits into two or more corresponding serial inputs.

44. An integrated circuit having quiescent current testing capabilities incorporated therein according to the method of claim 29 and at least one hierarchical block, said circuit comprising:

each said selected block having scannable memory elements arranged into one or more scan chain segments having a serial input and a serial output, said memory elements including peripheral memory elements associated with block inputs and outputs, said peripheral scannable memory elements being arranged in one or more peripheral scan chain segments, input peripheral elements associated with a block input being configurable in internal test mode for testing circuitry within said selected block and output peripheral memory elements associated with a block output being configurable in external test mode for testing circuitry external of said selected block;

means associated with each said segment for selectively connecting, in a quiescent current test mode, the serial input of said segment to a block serial input, or to the serial output of another scan chain segment, or to the serial output of a peripheral scan chain segment of a block located at one level of hierarchy down; and means for concurrently configuring input peripheral memory elements in internal test mode and output peripheral memory elements in an external test mode during quiescent current testing of said circuit.

45. A circuit as defined in claim 44, each said scan chain segments including:

internal memory element segments arranged on a scan path which includes a serial input of a selected block and a segment serial input of connected to:
a block serial input;
a serial output of another segment in said selected block; or
a serial output of a peripheral segment located in an embedded selected black;

peripheral segments arranged on a scan path which includes a block serial input and having a segment serial input connected to:
a block serial input,
a serial output of another peripheral segment in said block; or
a serial output of a peripheral segment located in an embedded block; and the block serial input of each said selected block being connected to a block serial input of its parent block.

46. A circuit as defined in claim 44, said peripheral memory elements being scannable functional memory elements which partition a block into an internal partition and an external partition.

47. A circuit as defined in claim 44, said peripheral memory elements being test dedicated peripheral memory elements.

48. A circuit as defined in claim 44, further including means for controlling serial inputs of scan chains independently of other hierarchical blocks in said circuit.

49. A circuit as defined in claim 44, further including means for selectively connecting to a block serial input of a parent block serial input.

50. A program product for use in designing an integrated circuit to facilitate quiescent current testing of said circuit, said circuit having at least one hierarchical block, said product comprising:

a computer readable storage medium;
means recorded on said medium for analyzing each of one or more selected hierarchical blocks independently of other selected blocks in the same or higher levels of hierarchy to identify circuit states of each said selected blocks which could result in elevated quiescent current levels during quiescent current testing of said circuit;
said means for analyzing beginning with a selected block at a lowest level of hierarchy and proceeding in sequence through each level of design hierarchy to a highest level of hierarchy containing a top-level block; and
means recorded on said medium for calculating a fault coverage for each said selected blocks.

51. A program product as defined in claim 50, further including means recorded on said medium for generating a simplified model of a block.

52. A program product as defined in claim 50, said means for analyzing further including:

means recorded on said medium for substituting a simplified model of any embedded selected blocks located one level down in design hierarchy in place of a complete description of said embedded selected blocks; and means recorded on said medium for determining the number of gates in a selected block, said means for calculating a fault coverage for each said selected blocks including calculating a weighted sum of the fault coverage of said block and said embedded blocks.

53. A program product as defined in claim 52, said weighted sum of the fault coverage being based on the number of gates in said selected block and each said embedded selected blocks.

54. A program product as defined in claim 52, said analyzing including:

means recorded on said medium for generating sequences of bits for all scannable memory elements in a selected block and peripheral memory elements in any embedded selected blocks, assigning said bits to said scannable memory elements and to peripheral memory elements of said embedded selected blocks located one level down in design hierarchy, and determining whether a generated sequence of bits results in an elevated quiescent current state.

55. A program product as defined in claim 50, said means for analyzing further including means for determining and storing a block initializing sequence of bits to be applied to a selected block prior to performing quiescent current testing of said circuit.

56. A program product as defined in claim 50, further including means recorded on said medium for performing a fault simulation of said circuit using quiescent current test patterns obtained in said analysis.

57. A program product as defined in claim 50, said means for analysis including:

means recorded on said medium for generating test patterns for a selected block using a simplified model of said embedded selected blocks in place of a complete description of said embedded selected blocks; and means recorded on said medium for calculating the total fault coverage for a selected block by calculating the weighted sum of the fault coverages of said selected block and other selected blocks embedded one level down in design hierarchy down.

58. A program product as defined in claim 57, said means for calculating the total fault coverage using a pseudo stuck-at fault coverage model or a toggle fault coverage model.

59. A program product as defined in claim 50, further including:

means recorded on said medium for inserting in said circuit means for configuring peripheral memory elements in a quiescent current mode during quiescent current testing of said circuit so that quiescent current test patterns loaded into said peripheral elements are applied to internal logic blocks and external logic blocks simultaneously.

60. A program product as defined in claim 59, said means for inserting excluding insertion of said means for configuring into said top-level block in said circuit.

61. A program product as defined in claim 50, said means for analyzing a selected block including means recorded on said medium for performing a static analysis of said selected block for determining whether an elevated current can result from any of the circuit states.

62. A program product as defined in claim 61, said means for analyzing a selected block further including means recorded on said medium for performing a fault simulation of logic contained in said selected block using a predetermined sequence of bits applied to said serial inputs as the only source of input stimulus.

63. A program product as defined in claim 62, said means for performing a fault simulation including applying a different sequence of bits to each block serial inputs.

64. A program product as defined in claim 62, said means for performing a fault simulation including applying the same sequence of bits to each block serial inputs.

65. A program product as defined in claim 62, said means for performing a fault simulation being operable to initialize all memory elements of said selected block to values contained in an initialization section of said predetermined sequence of bits immediately preceding a predetermined reference point of said predetermined sequence of bits and performing said fault simulation using values of said predetermined sequence including and/or following said predetermined reference point.

66. A program product as defined in claim 65, said means for performing a fault simulation being operable to use the same predetermined reference point in fault simulation of all of said selected blocks.

67. A program product as defined in claim 66, said means for analysis being operable to perform an analysis of a selected block for each of a predetermined number of points following said predetermined reference point of said predetermined sequence of bits.

68. A program product as defined in claim 50, further including means recorded on said medium for generating a pseudo-random sequence of bits for use as said predetermined sequence of bits.

69. A program product as defined in claim 50, said means for analyzing including means recorded on said medium for producing an analysis summary including reporting at least the number of gates of the block and the cumulative fault coverage of each said points after the reference point of said predetermined sequence of bits.

70. A program product as defined in claim 69, further including determining said cumulative fault coverage by calculating the weighted sum of the cumulative coverage of said selected block using the simplified model of embedded selected blocks located at the next level down of design hierarchy and the cumulative fault coverage of said embedded selected blocks.

71. A program product as defined in claims 69, said first pass including, starting with selected blocks at the lowest levels of design hierarchy, analyzing a selected block and storing a set of constraints indicating the points of said predetermined sequence which correspond to elevated quiescent current and test pattern information, said analysis considering the constraints of all embedded selected blocks and excluding analysis of any points of the sequence at which at least one selected block indicated an elevated quiescent current.

72. A program product as defined in claim 69, said second pass including, for each said selected block, fault simulating test patterns corresponding to the usable points of said predetermined sequence, determining the number of gates in the selected block, calculating fault coverage and storing the number of gates and fault coverage.

73. A program product as defined in claim 50, said performing an analysis of a selected block including performing said analysis in two passes, each pass beginning at the lowest level of hierarchy and ending at the highest level, a first of said passes identifying points of said predetermined sequence of bits at which quiescent current measurements can be performed and a second of said passes calculating the fault coverage based on the points of said predetermined sequence identified in said first pass.

74. A program product as defined in claim 50, further including:
means recorded on said medium for converting all functional memory elements in said circuit into scannable memory elements;
means recorded on said medium for converting memory elements at the boundaries of each selected block to peripheral memory elements in which input peripheral memory elements are selectively configurable in internal test mode and output peripheral memory elements are selectively configurable in external test mode;
means recorded on said medium for arranging memory elements into single scan chain configuration for each selected block;
means recorded on said medium for inserting in said circuit means for concurrently configuring peripheral memory elements in quiescent current test mode in which input peripheral memory elements are configured in internal test mode and output peripheral memory elements are configured in external test mode; and
means recorded on said medium for providing in said circuit a quiescent current scan chain configuration in which the single scan chain configuration of each selected block is active.

75. A program product as defined in claim 50, further including:
means recorded on said medium for arranging each scannable memory element scan chain segments of a selected block on a scan path which includes a serial input of said selected block by connecting a serial input of the segment to:
said block serial input,
a serial output of another segment or
a serial output of a segment in an embedded block located one level down in design hierarchy;
means recorded on said medium for connecting a selected block serial input of any selected blocks embedded in said selected block to said block serial input; and
means recorded on said medium for providing in said circuit means for concurrently configuring input peripheral memory elements in internal test mode and output peripheral memory elements in external mode.

76. A program product as defined in claim 75, said means for arranging scan chain segments further including:
means recorded on said medium for arranging internal segments in said selected block on a scan path which originates from a serial input of said selected block by connecting the serial input of said segment to:
a block serial input;
a serial output of another segment; or
a serial output of a peripheral segment located in an embedded block; and
means recorded on said medium for arranging peripheral segments in said selected block on a scan path which originates from a block serial input by connecting the serial input thereof to:
a block serial input,
a serial output of another peripheral segment in said block; or a serial output of a peripheral segment located in an embedded block.

77. A program product as defined in claim 75, each said segments comprising one or more scannable memory elements.

78. A program product as defined in claim 75, for each said selected block, arranging internal and peripheral scan chain segments therein into a single scan chain.

* * * * *